United States Patent [19]

Ochii et al.

[11] Patent Number: 4,528,646

[45] Date of Patent: Jul. 9, 1985

[54] SEMICONDUCTOR MEMORY WITH SELECTIVELY ENABLED PRECHARGE AND SENSE AMPLIFIER CIRCUITS

[75] Inventors: Kiyofumi Ochii; Hiroshi Iwahashi, both of Yokohama, Japan

[73] Assignee: Tokyo Shibaura Denki Kabushiki Kaisha, Kawasaki, Japan

[21] Appl. No.: 395,342

[22] Filed: Jul. 6, 1982

[30] Foreign Application Priority Data

Jul. 8, 1981 [JP] Japan ............................ 56-106498

[51] Int. Cl.³ ............................................ G11C 11/40
[52] U.S. Cl. .................................... 365/203; 365/230; 365/227
[58] Field of Search ............... 365/203, 227, 230, 189; 307/239

[56] References Cited

U.S. PATENT DOCUMENTS

| | | | |
|---|---|---|---|
| 3,969,706 | 7/1976 | Proebsting | 365/230 |
| 4,112,512 | 9/1978 | Arzubi et al. | 365/203 |
| 4,161,040 | 7/1979 | Satoh | 365/203 |
| 4,204,277 | 5/1980 | Kinoshita | 365/203 |
| 4,263,664 | 4/1981 | Owen et al. | 365/230 |
| 4,281,399 | 7/1981 | Yamamoto | 365/203 |
| 4,318,014 | 3/1982 | McAlister et al. | 365/203 |
| 4,350,992 | 9/1982 | Tubbs | 365/104 |
| 4,367,538 | 1/1983 | Shimada | 365/230 |
| 4,379,344 | 4/1983 | Ozawa et al. | 365/203 |
| 4,405,996 | 9/1983 | Stewart | 365/227 |

FOREIGN PATENT DOCUMENTS

| | | | |
|---|---|---|---|
| 0055582 | 12/1980 | European Pat. Off. | 365/227 |
| 55-132589 | 10/1980 | Japan | 365/227 |
| 2060303 | 4/1981 | United Kingdom | 365/227 |

*Primary Examiner*—James W. Moffitt
*Assistant Examiner*—Glenn A. Gossage
*Attorney, Agent, or Firm*—Cushman, Darby & Cushman

[57] ABSTRACT

Bit line precharge circuits, sense AMP circuits and input-output line precharge circuits are respectively divided into two groups by select circuits which are controlled by a select control signal. Only the selected precharge circuits and the sense AMP circuits are enabled before a readout operation. The peak current for precharging bit lines is reduced to one-half as compared to conventional circuits due to the decrease of stray capacitance to be precharged.

21 Claims, 12 Drawing Figures

SEMICONDUCTOR MEMORY WITH SELECTIVELY ENABLED PRECHARGE AND SENSE AMPLIFIER CIRCUITS

BACKGROUND OF THE INVENTION

I. Field of the Invention

This invention relates to semiconductor integrated memory circuits and more particularly to reductions in total current consumption and peak current levels during precharge operations of memory circuits.

II. Description of the Prior Art

The data capacity of semiconductor integrated memory circuits is quadrupling every two or three years, and this trend can be seen in all semiconductor integrated memory circuits including Random Access Memories (RAM) and Read Only Memories (ROM) with dynamic or static operation. However, the engineering difficulties of designing such large capacity semiconductor integrated memory circuits are staggering.

One problem is current consumption, particularly, the increase of momentary peak current during precharge operations. As the peak current increases, high frequency components in the power source potential are increasingly induced. This creates noise on some signal lines in an IC chip, which further results in misoperation and requires capacitors to absorb the noise. In a dynamic memory or a static memory with a dynamic operation, some signal lines are repeatedly precharged and discharged so that the same potential is applied to the signal lines before a read-out operation to speed up operation. The current for charging and discharging the signal lines has a momentary peak. Generally, as the memory capacity increases, the charge-discharge current increases, since stray capacitance associated with the main signal lines increases. The higher the operating speed of the memory circuit becomes, the higher the charge-discharge speed becomes and the sharper the peak current becomes.

FIG. 1 shows a static type memory cell 100 using cross-coupled N channel type enchancement mode MOS transistors 102 and 104 and high resistivity polycrystalline silicon (polysilicon) as load elements 106 and 108. Data is read out of and written into memory cell 100 through transfer gate MOS transistors 110 and 112 which selectively connect bit lines 114 and 116 with nodes 118 and 120. MOS transistors 110 and 112 are controlled by a control signal from a word line 122 for selecting memory cell 100.

FIG. 2 shows a conventional memory circuit having memory cells, as shown in FIG. 1, arranged in a matrix, with a peripheral circuit for controlling read-write operations. Memory cells 124-134 are connected with bit lines 136-142 and word lines 144-154. Balance type sense AMP circuits 156 and 158 are connected with bit lines 136-142 and are enabled by an enable signal from sense AMP enable line 160. Bit lines 136-142 are precharged to an initial level during a predetermined period of every access cycle by precharge circuits 162 and 164, as controlled by precharge control signals from precharge control line 166. A memory cell is selected by row decoder 168 and column decoder 170 which receive address signals, respectively. The bit lines, for example 136 and 138, are selected by column line 172, and are connected with common input-output lines 174 and 176 which are further connected with input-output line precharge circuit 178 and input-output circuit 180.

The common input-output lines 174 and 176 are precharged by input-output line precharge circuit 178 controlled by precharge control line 182.

During the precharge operation by precharge circuits 162 and 164, sense AMP circuits 156 and 158 are not activated. Accordingly, the precharge current by precharge circuits 162 and 164 and input-output line precharge circuit 178 flows to charge only stray capacitances Ca-Cd associated with bit lines 136-142, and stray capacitances Ce and Cf associated with input-output lines 174 and 176. Generally, the values of stray capacitances Ca-Cf are large, because the memory cells are arranged in a matrix, and the larger the memory capacity, namely the number of bits, the larger the stray capacitance value becomes. Accordingly, not only the average current consumption, but also the momentary peak current to charge the large capacitances becomes large.

SUMMARY OF THE INVENTION

Accordingly, an object of the present invention is to provide a semiconductor integrated memory circuit in which the peak current for precharging signal lines is reduced.

Another object of the present invention is to provide a semiconductor integrated memory circuit in which precharge lines are divided into groups, only one of which need be precharged at a time.

Yet another object of this invention is to provide a semiconductor integrated memory circuit in which current consumption is reduced.

According to this invention, a plurality of bit lines are connected to a plurality of memory cells. Circuitry is provided for addressing the memory cells. Each bit line is also associated with one of at least two precharge circuits. The precharge circuits precharge the associated bit lines to an initial level. Selection circuitry selects one of the precharge circuits. Since only the necessary bit lines are precharged, the precharging current level is reduced.

BRIEF DESCRIPTION OF THE DRAWINGS

The exact nature of this invention, as well as other objects and advantages thereof, will be readily apparent from consideration of the following specification relating to the annexed drawings, in which like reference characters designated the same or similar parts throughout the FIGURE thereof and wherein.

DESCRIPTION OF THE PREFERRED EMBODIMENT

Figure 1:
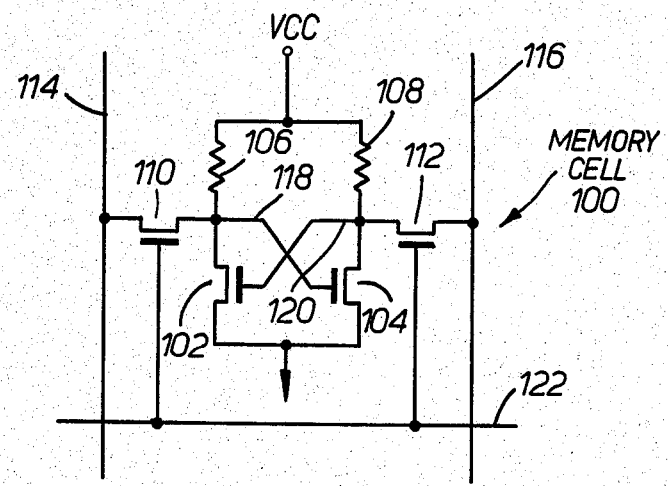
FIG. 1 is a circuit diagram showing a memory cell used in a static Random Access Memory.
Figure 4:
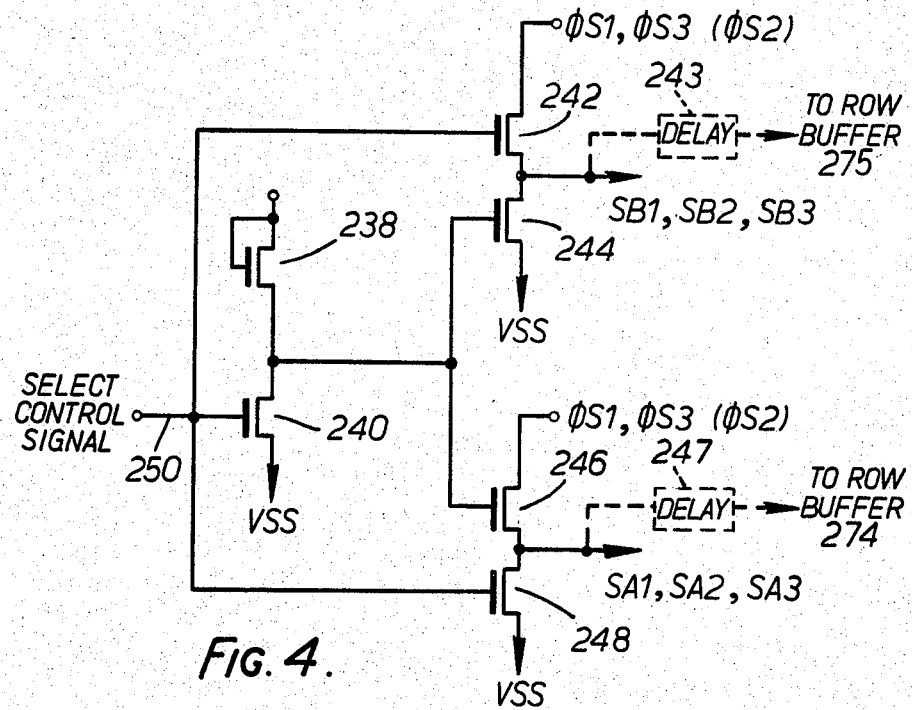
FIG. 4 is a circuit diagram of an example of a certain select circuit used in the Random Access Memory shown in FIG. 3.
Figure 2:
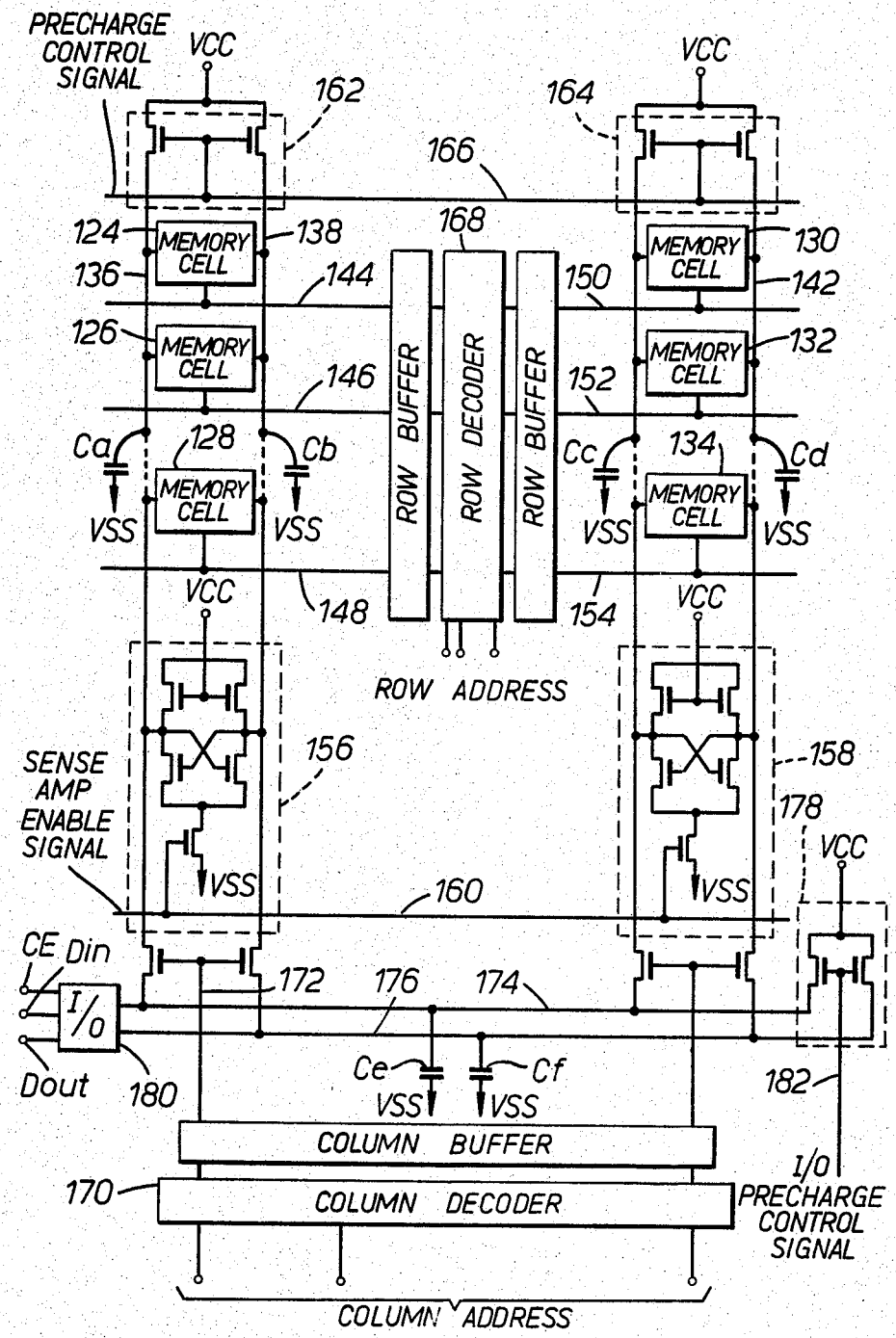
FIG. 2 is a circuit diagram showing a prior art Random Access Memory using MOS transistors.

There will now be discussed a semiconductor integrated memory circuit according to one embodiment of this invention with reference FIGS. 3, 4 and 5.

In the embodiment, precharge control line 200 and sense AMP enable line 202 are divided into two groups, 200a and 200b, and 202a and 202b, respectively. That is, bit line precharge circuit 204 and sense AMP circuit 208 are separated from bit line precharge circuit 206 and sense AMP circuit 210, respectively, by select circuits 212 and 214, respectively, which supply control signals $SA_1$, $SA_2$, $SB_1$ and $SB_2$ to the circuits. Furthermore, select circuit 216 divides input-output lines 218 and 222 from lines 220 and 224, respectively. Lines 218 and 222 are connected with input-output line precharge circuit 226, while lines 220 and 224 are connected with input-output line precharge circuit 228. The selected lines 218-224 are connected to input-output circuit 229 through signal lines 230 and 231. The input-output line precharge circuits 226 and 228 are respectively controlled by control signals $SA_3$ and $SB_3$ through lines 232 and 234 from select circuit 236. FIG. 4 shows the details of one example of select circuits 212, 214 and 236, which is constructed by MOS transistors 238-248. Control signals $SA_1$–$SA_3$ and $SB_1$–$SB_3$ are produced by a select control signal from control line 250. Furthermore select circuit 212 includes delay circuits 243 and 247 to enable row buffers 275 and 274, respectively, a predetermined time after signals $SB_1$ and $SA_1$ are generated.

Figure 5:
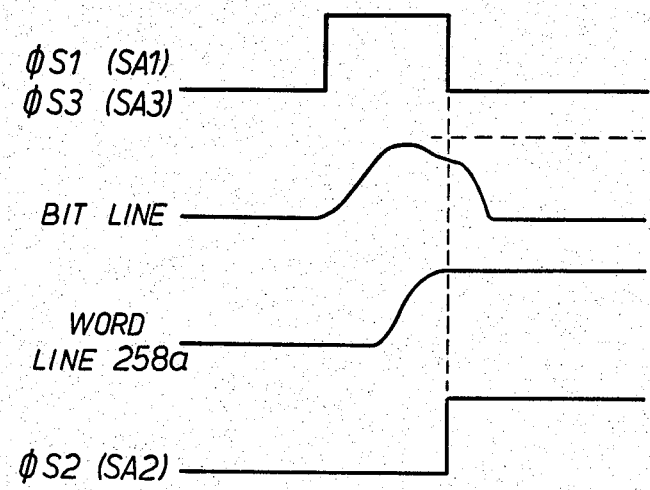
FIG. 5 is a timing diagram showing a read-out operation.

FIG. 5 shows a timing chart of a read-out operation. When data is read out of a memory cell 252, selected bit lines 254 and 256 and input-output lines 218 and 222 are precharged by signals $SA_1$ and $SA_3$, respectively. Here signals $SA_1$ and $SA_3$ are produced in synchronism with timing pulses $\phi S_1$ and $\phi S_3$. Thereafter, word line 258a is selected by row decoder 260 and a predetermined time (as controlled by delay circuit 247) after the $SA_1$ signal is generated, word line 258a is energized so that the level of bit lines slightly changes according to the stored data. Then signal $SA_2$, generated in synchronism with pulse $\phi_2$, is applied to sense AMP circuit 208 so as to amplify the read-out signal. Thus, pulses $\phi S_1$ and $\phi S_3$ are advanced with respect to pulse $\phi S_2$. Timing pulses $\phi S_1$, $\phi S_2$ and $\phi S_3$ are produced on the memory chip in an entirely conventional manner in response to each chip enable signal.

Figure 6:
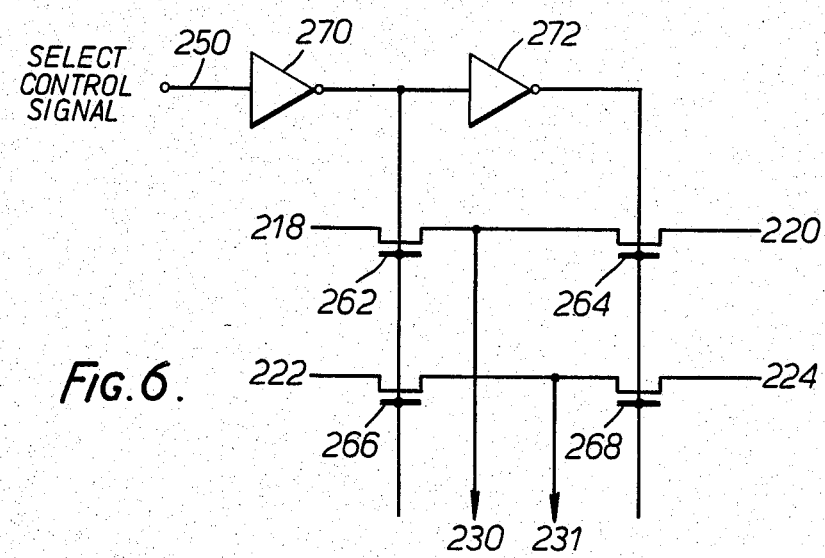
FIG. 6 is a circuit diagram of an example of another select circuit.

FIG. 6 shows the details of select circuit 216 using MOS transistors 262-268 and inverter circuits 270 and 272. Either input-output lines 218 and 222 or lines 220 and 222 are selected by select circuit 216 controlled by the select control signal on line 250.

For example, select control signal may be $B_0$, one of the column address signals $B_0$–$B_n$. If the select control signal ($B_0$) is "0", control signal $SA_1$ is produced and row buffer 274 is activated so as to select one of row lines $258a$–$258n$ corresponding to the output of row decoder 260. Similarly, control signals $SA_2$ and $SA_3$ are produced by the select control signal ($B_0$:0). As a result, either the left group of memory cells 252 or the right group of memory cells 276 is selected corresponding to the column address signal $B_0$ ("0" or "1"). As an alternative, the select control signal may be $A_0$, one of the row address signals $A_0$–$A_m$.

If one of memory cells 252 is selected, column line 278, corresponding to bit lines 254 and 256, is selected by column decoder 280. Control signals $SA_1$–$SA_3$ are produced by the select circuits 212, 214 and 236 to enable precharge circuit 204, sense AMP circuit 208 and input-output line precharge circuit 226. Then, select circuit 216 selects input-output lines 218 and 222, and data is read out through lines 230 and 231 and input-output circuit 229.

According to this embodiment, the memory device is divided into a left portion and a right portion and the precharging of bit lines and input-output lines only occurs in the selected portion. Precharge current flows to charge only stray capacitances Ca and Cb, associated with bit lines 254 and 256, and $Ce_1$ and $Cf_1$, associated with input-output lines 218 and 222. As a result, the capacitance value to be precharged is one half that of the conventional memory circuit. As is clear to those skilled in the art, the memory device may be divided into four or more portions.

Figure 3:
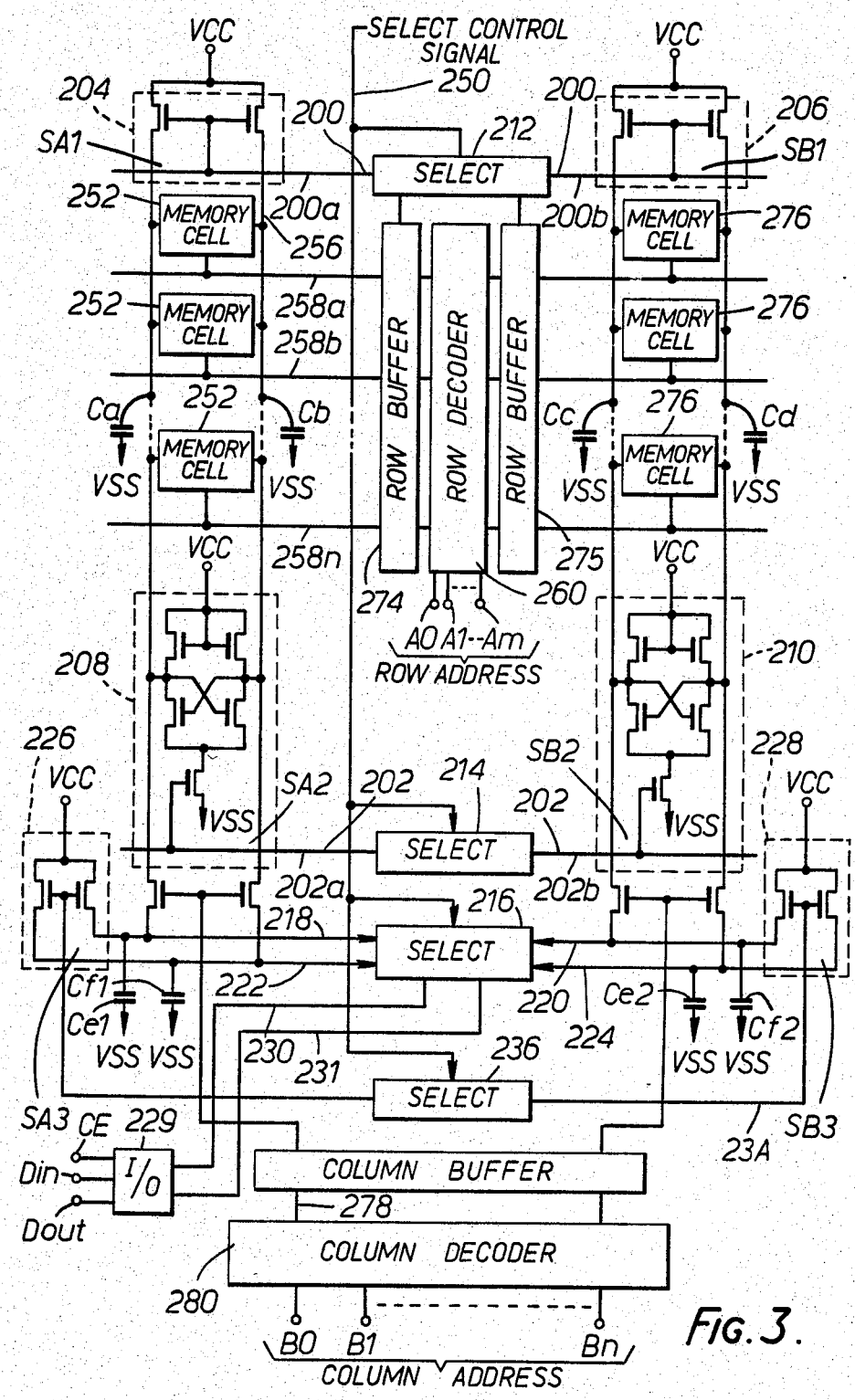
FIG. 3 is a circuit diagram showing a Random Access Memory of a first embodiment according to the present invention.
Figure 7:
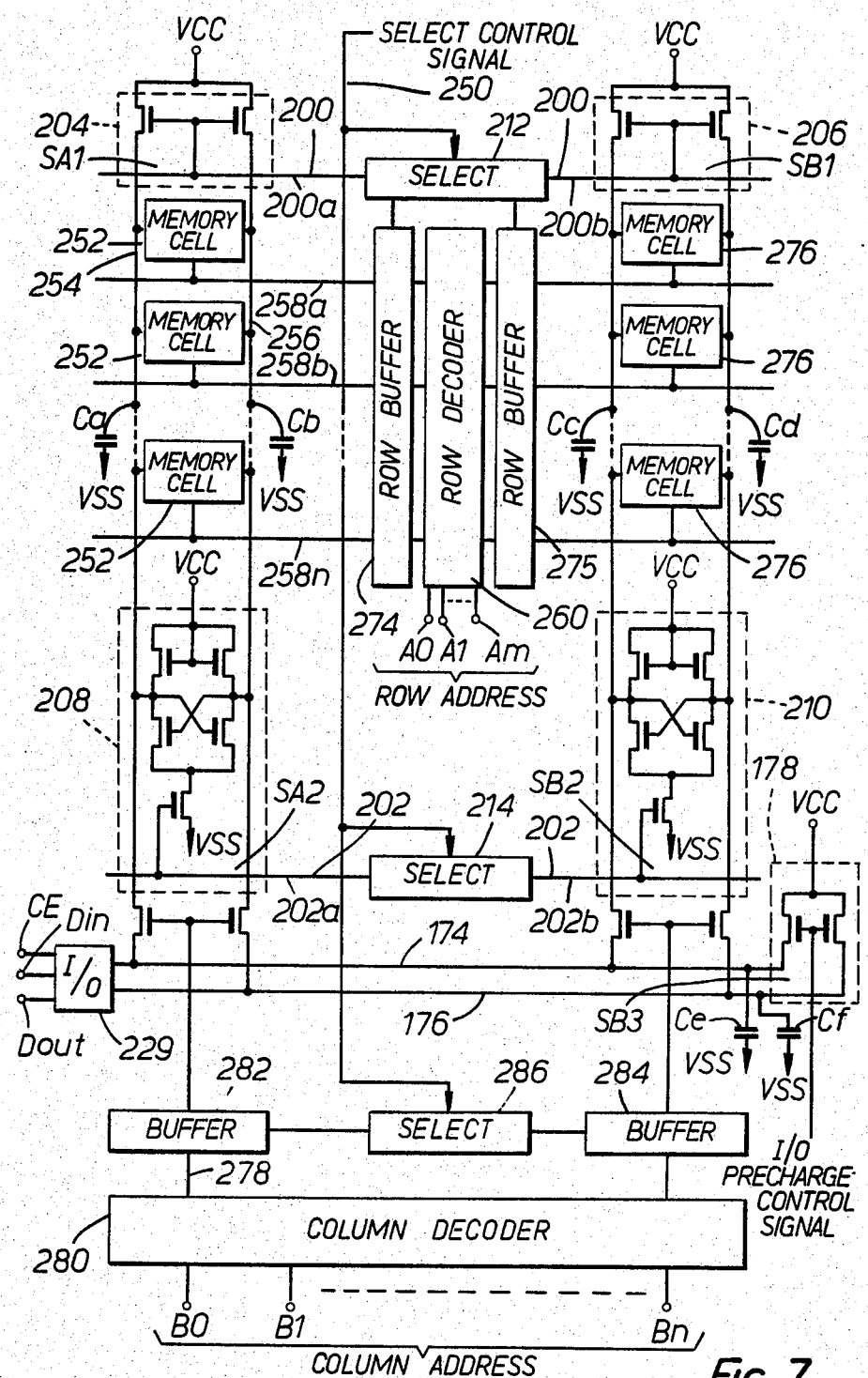
FIG. 7 is a circuit diagram showing a Random Access Memory of a second embodiment according to the present invention.

FIG. 7 shows a second embodiment according to this invention, in which the column buffer circuit is divided into two sections 282 and 284 by select circuit 286 and select circuits 216 and 236 in FIG. 3 are deleted. Remaining parts are the same as that of the memory device shown in FIG. 3.

Figure 8:
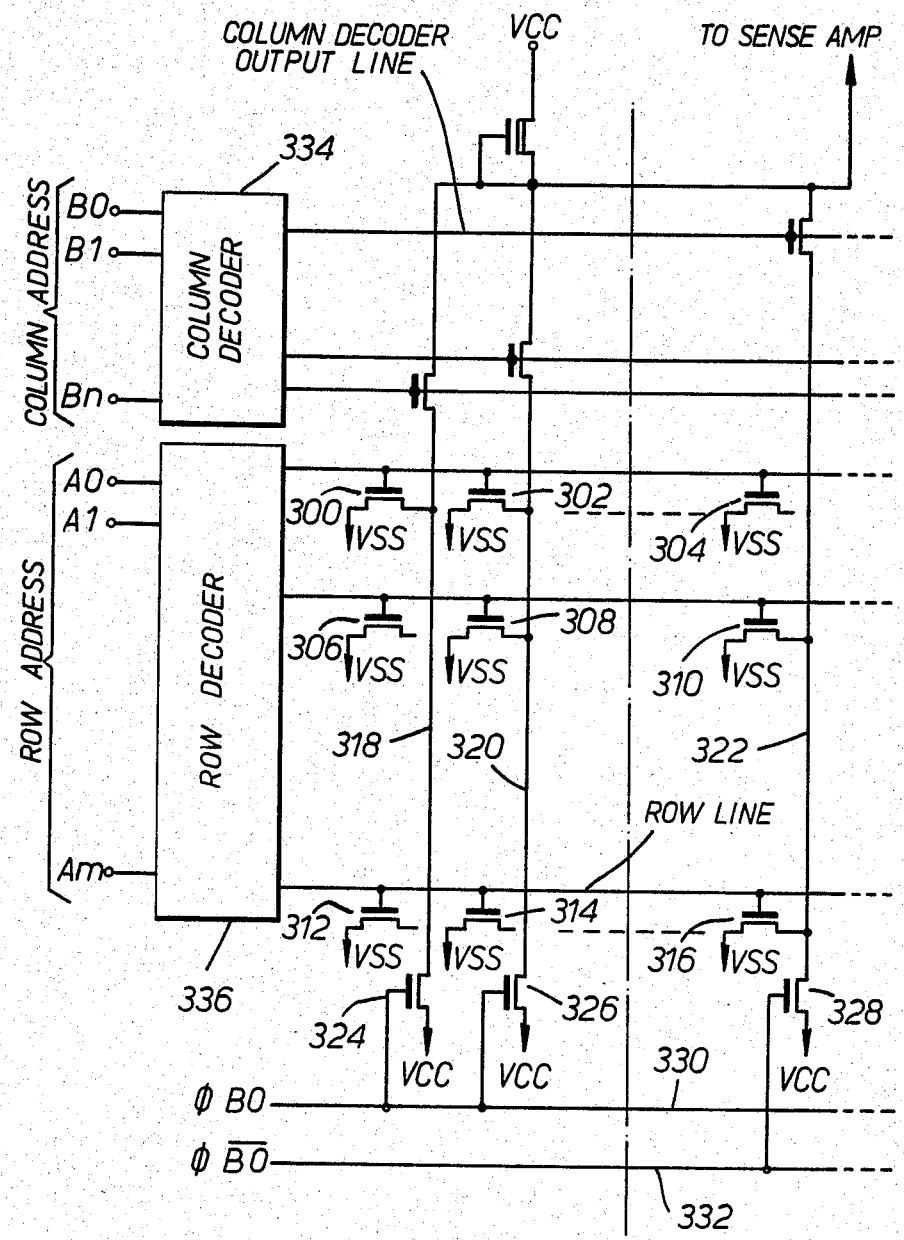
FIG. 8 is a circuit diagram showing a Read Only Memory of a third embodiment according to the present invention.
Figure 9:
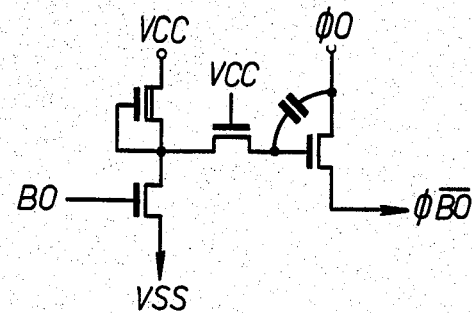
FIGS. 9 and 10 are precharge control signal generating circuits used in the Read Only Memory shown in FIG. 8.
Figure 10:
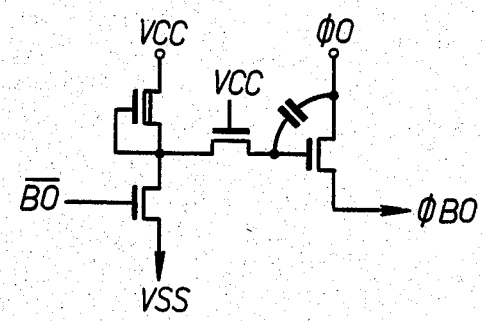
Figure 11:
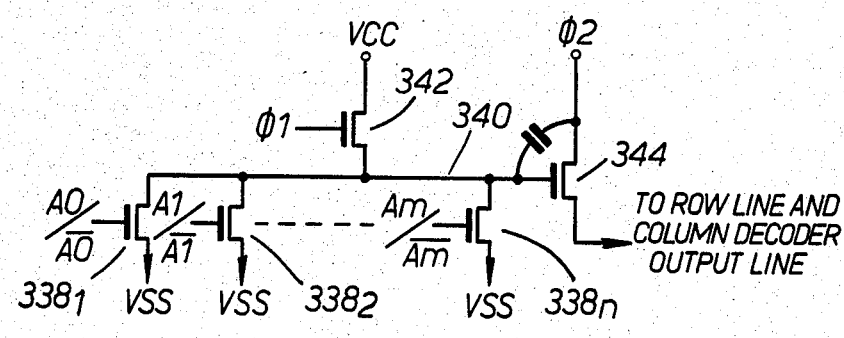
FIG. 11 is a detailed circuit of row and column decoders used in the Read Only Memory shown in FIG. 8.

FIG. 8 shows a third, Read Only Memory (ROM) embodiment according to this invention. Transistors 300-316 form a memory cell matrix. Whether "1" or "0" data is stored in any particular memory cell is determined by whether or not a drain electrode of the MOS transistor in the particular memory cell is connected to one of column lines 318-322. Column line precharge transistors 324-328 are used to precharge column lines 318-322 and are controlled by precharge control signals $\phi B_0$ and $\phi \overline{B_0}$ corresponding to a column address signal. That is, precharge control signals $\phi B_0$ and $\phi \overline{B_0}$ are produced by column address signal $B_0$ as shown in FIGS. 9 and 10. If address signal $B_0$ is "0" and control signal $\phi_0$ is 1, precharge control signals $\phi \overline{B_0}$ and $\phi B_0$ are "1" and "0", respectively. On the contrary, if address signal $B_0$ is "1", precharge control signals $\phi \overline{B_0}$ and $\phi B_0$ are "0" and "1", respectively. Precharge control line 330 which receives control signal $\phi B_0$ is connected with gate electrodes of precharge transistors 324 and 326, while line 332, which receives control signal $\phi \overline{B_0}$ is connected with the gate electrode of transistor 328. Thus, the column lines are divided into two groups by precharge control signals $\phi B_0$ and $\phi \overline{B_0}$. Column line 322, addressed when column address $B_0$:0 is controlled by precharge control signal $\phi \overline{B_0}$, and column lines 318 and 320, addressed by column address $B_0$:1 is controlled by precharge control signal $\phi B_0$. FIG. 11 shows a detailed circuit used in column decoder 334 and row decoder 336. Address signals $A_0$–$A_m$ and $B_0$–$B_n$ are applied to gate electrodes of MOS transistors $338_1$–$338_n$. At first, line 340 is precharged by transistor 342 to whose gate pulse $\phi_1$ is applied (see FIG. 12).

Figure 12:
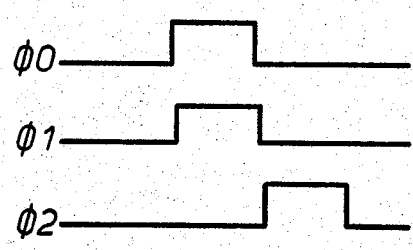
FIG. 12 is a time chart showing a relationship among the pulses $\phi_0$–$\phi_2$.

If all of MOS transistors are rendered non-conductive, MOS transistor 344 is turned on and some row line or column decoder output line is set "1" by pulse $\phi_2$ (see FIG. 12). Namely, one of the row lines or column decoder output lines is selected by the decoders. As a result of the action of decoders 334 and 336, one of transistors 300-316 has both its gate and drain energized. If a drain electrode of the selected MOS transistor (such as transistor 300) is connected to the column line, the column line is discharged by the MOS transistor. Then, the level of the column line, that is "0", is read out by a sense AMP circuit. If the drain electrode of the MOS transistor is not connected to the column line, the level of the column line is kept at a "1" state.

In the embodiment, the memory circuit is divided into two portions by column address signal $B_0$. However, the circuit may be divided into four portions by a combination of column address signals $B_0$ and $B_1$.

According to this invention, the memory circuit is divided into a number of portions and precharging occurs only in the selected portion. The current for charging and discharging stray capacitances is decreased compared to a conventional circuit. Therefore, the average current consumption and peak current are greatly decreased.

Although this invention has been disclosed and illustated with reference to particular applications, the principles involved are susceptible of numerous other applications which will be apparent to those skilled in the art. The invention is, therefore, limited only as indicated by the scope of the claims.

What is claimed is:

1. A semiconductor integrated memory device comprising:
   a plurality of bit lines;
   a plurality of memory cells each connected to at least one of said bit lines;
   means for addressing said memory cells including a plurality of word lines divided into at least first and second sets, each of said memory cells being connected to at least one of said word lines, a plurality of means each for selectively enabling any of said work lines of said at least first and second sets, respectively;
   at least two precharge means, at least first and second groups of said bit lines connected to those of said memory cells associated with said at least first and second sets of said word lines being connected to said at least two precharge means, respectively, said precharge means for precharging the associated group of said bit lines to an initial level; and
   select means for selecting one of said bit line precharge means and a corresponding one of said enabling means.

2. The semiconductor integrated memory device according to claim 1 further including a plurality of input-output buses, each connected to a single one of said bit line groups, respectively, and a second select means for selecting one of said input-output buses.

3. The semiconductor integrated memory device according to claim 2 further comprising:
   a plurality of means each for individually precharging a single one of said input-output buses; and
   third select means for controlling which of said input-output bus precharging means is operative.

4. The semiconductor integrated memory device according to claim 3 further comprising an input-output circuit connected to said input-output buses through said second select means.

5. The semiconductor integrated memory device according to claim 1, 2, 3 or 4 further comprising:
   a plurality of sense amplifying means each for amplifying signals on a single one of said groups of bit lines, respectively; and
   fourth select means for selectively enabling one of said sense amplifying means.

6. The semiconductor integrated memory device according to claim 3 or 4 wherein said first, second and third select means are controlled by a select control signal.

7. The semiconductor integrated memory device according to claim 6 wherein said select control signal corresponds to signals for addressing said device.

8. The semiconductor integrated memory device according to claim 7 wherein said address signals are column address signals.

9. The semiconductor integrated memory device according to claim 7 wherein the address signals are row address signals.

10. A semiconductor integrated memory device comprising:
    a plurality of bit lines and row lines;
    row decoder means for selectively energizing said row lines;
    a plurality of memory cells, each connected to at least one of said bit lines and controlled by one of said row lines;
    at least two precharge means, each connected to a group of said bit lines for precharging said bit lines in said groups to an initial level, each of said precharge means being controlled by precharge control lines;
    first select means for selecting one of said precharge control lines;
    a plurality of input-output lines each connected to a single one of said bit line groups;
    a plurality of input-output line precharging means each associated with a single one of said input-output lines for precharging said input-output lines;
    second select means for selecting one of said input-output lines;
    third select means for selecting one of said input-output line precharge means; and
    a select control signal line connected to said first, second and third select means.

11. The semiconductor integrated memory device according to claim 10 further comprising:
    sense amplifier circuits, at least one operative with each of said bit line groups;
    an enable control line associated with each of said sense amplifier circuits; and
    fourth select means for selection of said sense amplifier circuit enable control lines.

12. A semiconductor integrated memory device comprising:
    a plurality of bit lines;
    a plurality of row lines divided into at least first and second sets;
    a plurality of means each for selectively enabling any of said row lines of said at least first and second sets, respectively;
    a plurality of memory cells, each connected to at least one of said bit lines and controlled by one of said row lines;
    at least two precharge means, each connected to a group of said bit lines respectively connected to those of said memory cells associated with one of said at least first and second sets of row lines for precharging said bit lines in said groups to an initial level;

first select means for selecting one of said precharge means and a corresponding one of said enabling means;

input-output lines connected to said bit line groups;

column decoder means for selecting one of said bit lines;

one column buffer circuit connected between said decoder and said bit lines in each of said groups; and second select means for selecting one of said buffer circuits.

13. The semiconductor integrated memory circuit according to claim 12 further comprising a select control signal line connected to said first and second select means.

14. A semiconductor integrated memory device comprising:

a plurality of bit lines;

a plurality of memory cells each connected to at least one of said bit lines;

means for addressing said memory cells;

at least two precharge means, a predetermined group of said bit lines being connected to each of said precharge means, respectively, said precharge means for precharging the associated group of said bit lines to an initial level;

first select means for selecting one of said bit line precharge means;

a plurality of input-output buses, each connected to a single one of said bit line groups, respectively;

a second select means for selecting one of said input-output buses;

a plurality of means each for individually precharging a single one of said input-output buses; and third select means for controlling which of said input-output bus precharging means is operative.

15. The semiconductor integrated memory device according to claim 14 further comprising an input-output circuit connected to said input-output buses through said second select means.

16. The semiconductor integrated memory device according to claim 14 or 15 further comprising:

a plurality of sense amplifying means each for amplifying signals on a single one of said groups of bit lines, respectively; and fourth select means for selectively enabling one of said sense amplifying means.

17. The semiconductor integrated memory device according to claim 14 or 15 wherein said first, second and third select means are controlled by a select control signal.

18. The semiconductor integrated memory device according to claim 17 wherein said select control signal corresponds to signals for addressing said device.

19. The semiconductor integrated memory device according to claim 18 wherein said address signals are column address signals.

20. The semiconductor integrated memory device according to claim 18 wherein the address signals are row address signals.

21. A semiconductor integrated memory device comprising:

a plurality of bit lines and row lines;

row decoder means for selectively energizing said row lines;

a plurality of memory cells, each connected to at least one of said bit lines and controlled by one of said row lines;

at least two precharge means, each connected to a group of said bit lines for precharging said bit lines in said groups to an initial level, each of said precharge means being controlled by precharge control lines;

first select means for selecting one of said precharge control lines;

a plurality of input-output lines each connected to a single one of said bit line groups;

a plurality of input-output line precharging means each associated with a single one of said input-output lines for precharging said input-output lines;

second select means for selecting one of said input-output lines;

third select means for selecting one of said input-output line precharge means;

a select control signal line connected to said first, second and third select means;

sense amplifier circuits, at least one operative with each of said bit line groups;

an enable control line associated with each of said sense amplifier circuits; and fourth select means for selection of said sense amplifier circuit enable control lines.

* * * * *